(12) United States Patent
Alford et al.

(10) Patent No.: US 7,446,037 B2
(45) Date of Patent: Nov. 4, 2008

(54) CLADDED SILVER AND SILVER ALLOY METALLIZATION FOR IMPROVED ADHESION AND ELECTROMIGRATION RESISTANCE

(76) Inventors: Terry L. Alford, 110 W. Glen Haven Dr., Phoenix, AZ (US) 85045; Ekta Misra, 2725 NW. Overlook Dr., #1927, Hillsboro, OR (US) 97124

( * ) Notice: Subject to any disclaimer, the term of this patent is extended or adjusted under 35 U.S.C. 154(b) by 321 days.

(21) Appl. No.: 11/208,251

(22) Filed: Aug. 18, 2005

(65) Prior Publication Data
US 2006/0199360 A1    Sep. 7, 2006

Related U.S. Application Data

(60) Provisional application No. 60/602,762, filed on Aug. 18, 2004.

(51) Int. Cl.
*H01L 21/00* (2006.01)
(52) U.S. Cl. .................. 438/644; 438/686; 438/688; 257/E21.575
(58) Field of Classification Search ........... 438/642, 438/644, 650, 652, 654, 686, 688
See application file for complete search history.

(56) References Cited

U.S. PATENT DOCUMENTS 6,023,100 A * 2/2000 Tao et al. .................. 257/762

6,100,194 A * 8/2000 Chan et al. ................ 438/686
6,486,514 B2 * 11/2002 Jeong et al. ............... 257/350

OTHER PUBLICATIONS

Kim, H.C. et al."Improvement of the thermal stability of silver metallization," J. App. Phys. vol. 94, No. 8, Oct. 15, 2003, pp. 5393-5395.
Nguyen, P. et al. "Novel technique to pattern silver using CF4 and CF4/O2 glow discharges," J. Vac. Sci. Technol. B 19(1), Jan./Feb. 2001, pp. 158-165.
Kim, H.C. et al. "Comparison of texture evolution in Ag and Ag(Al) alloy thin films on amorphous SiO2," J. App. Phys. vol. 95, No. 9 May 1, 2004, pp. 5180-5188.
Hauder, M. et al., "Scaling properties and electromigration resistance of sputtered Ag metallization lines," Feb. 5, 2001, 838-840, Applied Physics Ltrs vol. 78 No. 6.

* cited by examiner

*Primary Examiner*—Charles D. Garber
*Assistant Examiner*—Reema Patel
(74) *Attorney, Agent, or Firm*—Schwabe, Williamson & Wyatt, P.C.

(57) ABSTRACT

In semiconductor integrated circuit and device fabrication interconnect metallization is accomplished by a clad Ag deposited on a SiO2 level on a Si surface. The clad Ag has a layer of an alloy of Ag and Al (5 atomic %) contacting the SiO2, a layer of substantially pure Ag and an outer layer of the Ag and Al alloy. The alloy improves adhesion to the SiO2, avoids agglomeration of the Ag, reduces or eliminates diffusion at the SiO2 surface, reduces electromigration and presents a passive exterior surface.

18 Claims, 2 Drawing Sheets

CLADDED SILVER AND SILVER ALLOY METALLIZATION FOR IMPROVED ADHESION AND ELECTROMIGRATION RESISTANCE

CROSS REFERENCE TO RELATED APPLICATIONS

This application claims priority from the U.S. provisional patent application Ser. No. 60/602,762 filed on Aug. 18, 2004 in the name of Terry L. Alford and Ekta Misra entitled "Cladded Silver and Silver Alloy Metallization for Improved Adhesion and Electromigration Resistance" incorporated herein by reference.

FIELD OF THE INVENTION

This invention relates to conductive interconnects for integrated circuits and more particularly to deposited silver (Ag) interconnects clad in a deposited silver-aluminum (Ag (Al)) alloy.

BACKGROUND

Continuous shrinkage in device dimensions in ultra-large-scale-integration (ULSI) technologies has resulted in interconnects being subjected to high current densities and thermal stresses leading to their premature failure. Electromigration is one of the governing phenomenon which contributes to early failure of interconnects. Choices of metallization is an important parameter that affects the performance of chip interconnects. Until recently, Al was considered as the ideal interconnect metallization, but its relatively high resistivity (~2.7 $\mu\Omega$-cm) and poor electromigration resistance have led to an ongoing search for a better replacement. Ag is one of the potential interconnect materials and has excellent electromigration resistance. However, Ag tends to agglomerate at higher temperatures, and does not adhere too well to dielectrics due to its inert nature when in contact with most materials.

The closest art is believed to be PCT application Serial No. PCT/US04/028705 entitled "Thermal Stability for Silver Metallization," of Kim and Alford, filed Sep. 2, 2004, claiming priority from U.S. provisional patent application Ser. No. 60/499,645. Both applications are incorporated herein by reference. Like the provisional application, the PCT application mainly deals with the thermal stability of Ag(Al) alloy thin films on $SiO_2$ in terms of prevention of agglomeration and improvement of adhesion between the metallization and the substrate. The present invention, however, deals with a cladded Ag metallization structure.

BRIEF SUMMARY

In accordance with the present invention interconnects for integrated circuits, components and devices of substantially pure Ag are clad in an Ag (Al) alloy. Preferably, in an exemplary embodiment, an Ag (Al) alloy is deposited on a semiconductor oxide layer to a thickness of from about 6 nm to 12 nm, and preferably from about 8 nm to about 10 nm. A layer of substantially pure Ag is then deposited on the thin alloy film. A further thin film of the Ag (Al) is then deposited over the Ag to a thickness of preferably from about 3 nm to about 10 nm and more preferably from about 4 nm to about 6 nm. The alloy in accordance with the preferred exemplary embodiment has Al content in a range from about 0.5 atomic % to about 5 atomic % and more preferably in a range from greater than about 0.5 atomic % to about 2 atomic %, the remainder of the alloy content being substantially pure Ag.

Put another way, in the preferred embodiment, the layer of alloy deposited on the oxide layer is of a thickness sufficient to create a continuous film separating the Ag from the underlying oxide. This prevents agglomeration and the alloy film on the oxide is also of a thickness so as to prevent diffusion of the silver into the oxide. The further alloy film deposited over the Ag is of a thickness so as to be a continuous film capable of passivating the Ag upper surface. In the preferred exemplary embodiment the oxide is $SiO_2$ grown on a Si wafer.

The clad structure is intended to alleviate problems of adhesion and agglomeration observed in pure Ag films and is put forth as a replacement for Al and Cu interconnect metallization in the microelectronics industry because of the reasons listed below:
  a) Less processing steps in comparison to Cu metallization.
  b) Lower overall resistance in comparison to both Al and Cu metallization.
  c) Better electromigration resistance compared to Al, Cu and pure Ag. According to previous study the activation energies of pure Ag (0.58 eV) and Cu (0.67 eV) metallization are similar thus their failure times would also be similar [M. Hauder, J. Gstottner, W. Hansch, and D. Scmitt-Landsiedel, Appl. Phys. Lett., 78, 838 (2001)]. However, as has been shown experimentally in this study the failure time of the clad structure is 38 times better than that of pure Ag, thus leading to the conclusion that the electromigration resistance of the proposed metallization structure would also be better than that of Cu.
  d) No agglomeration observed at elevated temperatures.
  e) Better adhesion to $SiO_2$ compared to pure Ag metallization.

This invention solves the problems of electromigration and Joule heating-induced early failure of interconnect metallization. It also alleviates problems, viz. agglomeration and poor adhesion to $SiO_2$ associated with pure Ag metallization.

This invention can be used as:
  a) Interconnect metallization for conventional microelectronics as well as high temperature applications.
  b) Contacts used in organic light emitting diodes and also as metallization in large scale (Generation II and greater) flexible displays and flexible electronics with minimum voltage drop at room temperatures.

As used herein "interconnects" means conductive traces, pads, contacts or other conductive features or areas of an integrated circuit, a component or a device, from the very smallest feature in ULSI circuitry to the aforementioned large scale flexible display features.

For conventional electronics, microelectronics fabrication industries can use this invention. Also fabrication companies which are still using Al as interconnect metallization can switch to the Ag and Ag alloy clad structure proposed here and forgo the difficulties of Cu processing (etching, step coverage, CMP). For high temperature electronics, automotive companies are interested in electronics for under the hood applications. The invention is useful for flexible OLED displays and flexible electronics also.

This invention will be useful for interconnect metallization used for conventional microelectronics as well as high temperature applications. The Alford group at Arizona State University previously developed a reactive ion etch process for Ag metallization. See "Novel technique to pattern silver using $CF_4$ and $CF_4/O_2$ glow discharges," P. Nguyen, Y. Zeng, and T. L. Alford, J. Vac. Sci. Technol. B 19, 158 (2001), incorporated herein by reference. The conjunction with these two technologies will also enable smaller fabrication facilities to use current Al etch processes and extend their usefulness by not encumbering the cost of chemical mechanical polishing toolsets associated with copper metallization and the accompanying diffusion barrier technology. Moreover, the low resistivity and good adhesion properties makes this metallization compatible with the Ag contacts used in organic light emitting diodes.

DETAILED DESCRIPTION

Figure 1:
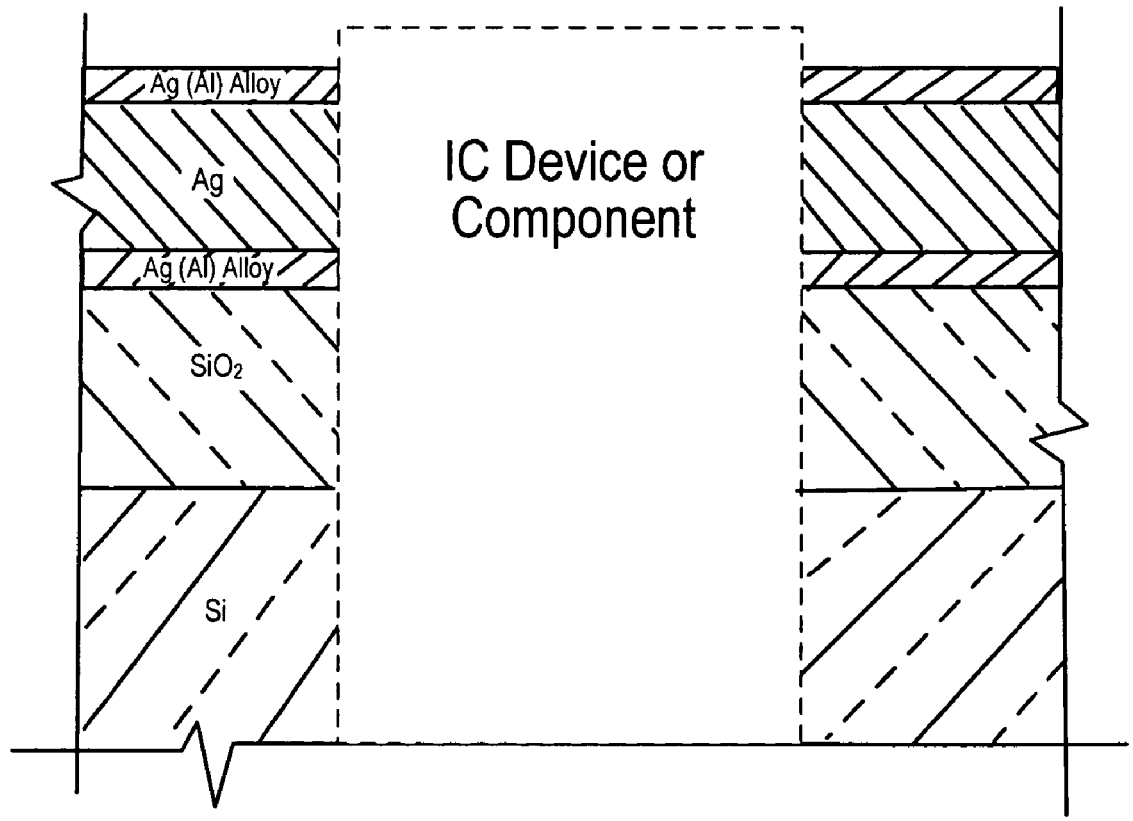
FIG. 1 is a fragmentary cross-sectional view, not to scale, of Ag interconnects clad in Ag (Al) alloy, in accordance with the invention, on a $SiO_2$ layer of an integrated circuit.

The silver-silver alloy clad structure proposed here consists of layers of Ag (Al-5 atomic %)/Ag/(Ag(Al-5 atomic %)/$SiO_2$. A cross-section of such a structure is shown in FIG. 1. Silver does not adhere well to $SiO_2$. It undergoes agglomeration at higher temperatures (>200° C.), and it is susceptible to oxidation and sulfurization. Previous study has shown that addition of Al (5 atomic %) prevents the agglomeration of Ag at higher temperatures (>400° C.) and thus improves the adhesion of the alloy to $SiO_2$ See "Improvement of the thermal stability of silver metallization," H. C. Kim, and T. L. Alford, J. Appl. Phys., 94, 5393 (2003), incorporated herein by reference.

The Ag(Al) alloy layer in contact with the oxide layer on a wafer acts as an adhesion layer between $SiO_2$ and the subsequent layers of metals/dielectrics. The alloy thin film on the top of the oxide acts as a cladding layer for the pure Ag and thus reduces surface diffusion and enhances the electromigration resistance of the stack structure. The electromigration behavior of the entire structure is further improved because the Ag alloy encapsulation, being harder due to solution hardening effect, produces compression stress between the Ag alloy-Ag interface thus leading to reduced hillock formation and also since most of the current flows through the Ag layer due to its comparatively lower resistivity. Thus the Joule heating effect in the clad structure is lower. The present structure, then, is based on the proposition that the use of the Ag(Al) alloy layers in such a clad structure offsets the need for extra diffusion barrier layers and also improves the overall electromigration behavior of the structure.

The Ag (Al) alloy should contain Al from about 0.5 atomic % to about 5 atomic %, the remainder of the alloy being substantially pure Ag. Preferably the percentage of aluminum in the alloy is between greater than about 0.5 atomic % to about 2 atomic %. The thickness of the thin alloy film in contact with the SiO2 can range between about 6 nm to about 12 nm, more preferably from about 8 nm to about 10 nm. A benefit of this construction is that the Ag layer thickness has no criticality and may be of any of a wide range of thicknesses. The final Ag (Al) alloy layer can have a thickness in the range from about 3 nm to about 10 nm, and more preferably is from about 4 nm to 6 nm thick.

Experimental Fabrication

Figure 2:
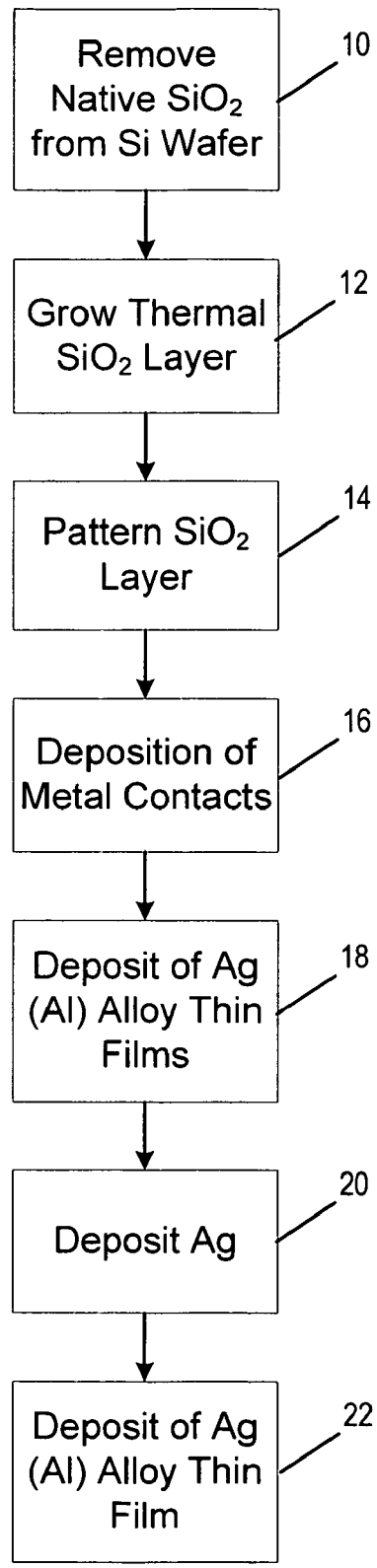
FIG. 2 is a flow chart representative of the steps of formation of the Ag (Al) alloy clad Ag interconnects of FIG. 1.

The Ag(Al) alloy of a specific exemplary experimental embodiment was 5 atomic % Al. The source of the Ag(Al) alloy was prepared by forming a solid solution of 95 atomic % pure Ag slugs and 5 atomic % pure Al slugs in the electron-beam (e-beam) evaporator. Single-line test structures of 3.75 µm line widths of pure Ag, Ag(Al) alloy and Ag(Al)/Ag/Ag(Al) on $SiO_2$ were fabricated on (100)-oriented p-type silicon wafers with nominal resistivity between 0.2 and 0.8 Ω-cm by standard lift-off technique. The Si wafers were dipped in HF for 30 s to remove native oxide as indicated at 10 in the process flow chart of FIG. 2. Then ~200 nm of thermal oxide was grown as indicated at 12. At this point in the formation of an integrated circuit, the $SiO_2$ layer would be patterned as is conventional, as indicated at 14. This then was followed by deposition of metal contacts as at 16.

Experimentally, as indicated at 18, 20 and 22, without breaking vacuum, clad structures were obtained by sequential deposition of the Ag(Al) alloy (~10 nm), the pure Ag (~130 nm) and the Ag(Al) alloy (~10 nm) on the patterned oxide of the wafer using an e-beam evaporator at a base pressure of $3 \times 10^{-6}$ torr and deposition pressure of $4 \times 10^{-6}$ torr. The pure Ag and Ag(Al) alloy metal depositions were also done by known e-beam evaporation technique. The deposition environment pressure should be as near to null as possible.

Test Results

The failure time of the fabricated single line test structures was determined using a Tektronics 372 Semiconductor Workbench. In order to accelerate the failure of the structures the testing was done at elevated temperatures by placing the samples on a resistance heated hot stage. The test structures were all subjected to a constant current (0.15 A) and temperature conditions (190° C.) and their corresponding failure times were obtained. The failure criterion for the test lines was set to be complete open circuit. Table I below gives the resistivity in µΩ-cms and failure times in seconds obtained for the three different structures (Ag/$SiO_2$, Ag(Al)/$SiO_2$ and Ag(Al)/Ag/Ag/(Al)/$SiO_2$) under the set temperature and current conditions.

TABLE I

| Structure Type | Resistivity (µΩ-cm) | Failure Time(s) |
| --- | --- | --- |
| Ag/$SiO_2$ | 1.84 | 576 |
| Ag(Al)/$SiO_2$ | 2.14* | 3,276 |
| Ag(Al)/Ag/Ag(Al)/$SiO_2$ | 2.05 | 21,672 |

*Effective resistivity of the overall cladded stack structure

As observed in the Table 1 above, the failure time of Ag(Al)/$SiO_2$ structures was about six times better than that of pure Ag because the alloy does not agglomerate on the $SiO_2$ thus there is reduced surface diffusion and hence enhanced electromigration lifetime. In case of the clad structure the failure time is nearly 38 times better than pure Ag and almost 7 times better than that of the alloy structure because of the reasons cited in the previous section. Thus it has been experimentally proven that the cladded Ag and Ag alloy structure shows better adhesion and electromigration resistance compared to pure Ag and can be thus proposed to be used as high temperature interconnect metallization.

While one or more specific preferred embodiments have been described application, those skilled in the art will readily recognize modifications, variations and equivalents that do not depart from the spirit and scope of the subject invention, as herein claimed.

We claim:

1. An apparatus comprising:
   a substrate;
   an oxide layer formed over the substrate; and
   a conductive interconnect including:
     a first layer of a silver (Ag)-aluminum (Al) alloy formed on and in direct contact with the oxide layer;

an Ag layer formed on and in direct contact with the first layer; and a second layer of a Ag-Al alloy formed on and in direct contact with the Ag layer, the first and the second layers including Al in a range from about 0.5 atomic % to 5 atomic %.

2. The apparatus of claim 1, wherein the first layer separates the Ag layer from the oxide layer and has a thickness sufficient to substantially reduce or eliminate reaction of the Ag layer with the oxide layer.

3. The apparatus of claim 2, wherein the first layer has a thickness of greater than about 6 nm.

4. The apparatus of claim 2, wherein the second layer has a thickness in excess of about 8 nm.

5. The apparatus of claim 1, wherein the second layer has a thickness sufficient to passivate the Ag layer.

6. The apparatus of claim 5, wherein the second layer has a thikness in a range from about 3 nm to about 10 nm.

7. The apparatus of claim 1, wherein at least one of the first and second layer includes Al in a range from about 0.5 atomic % to about 2 atomic %.

8. The apparatus of claim 1, wherein the Ag layer consists of substantially pure Ag.

9. The apparatus of claim 1, wherein the apparatus is an integrated circuit and wherein the conductive interconnect forms, at least in part, an interconnect metallization structure for the integrated circuit.

10. The apparatus of claim 1, wherein the apparatus is a selected one of a flexible display device or a flexible electronic device.

11. The apparatus of claim 10, wherein the apparatus is an organic light emitting diode (OLED) display device, and wherein the conductive interconnect is a diode contact.

12. A method comprising:
providing a substrate;
forming an oxide layer over the substrate; and
forming a conductive interconnect by:
forming a first layer of a silver (Ag)-aluminum (Al) alloy on and in direct contact with the oxide layer;
forming an Ag layer on and in direct contact with the first layer; and
forming a second layer of a Ag-Al alloy on and in direct contact with the Ag layer, the first and the second layers including Al in a range from about 0.5 atomic % to 5 atomic %.

13. The method of claim 12, wherein said forming of the first layer comprises forming the first layer with a thickness sufficient to substantially reduce or eliminate reaction of the Ag layer with the oxide layer.

14. The method of claim 13, wherein said forming of the first layer comprises forming the first layer with a thickness of greater than about 6 nm.

15. The method of claim 12, wherein forming of the second layer comprises forming the second layer with a thickness in excess of about 8 nm.

16. The apparatus of claim 12, wherein forming of the second layer comprises forming the second layer with a thickness sufficient to passivate the Ag layer.

17. The method of claim 16, wherein forming of the second layer comprises forming the second layer with a thickness in a range from about 3 nm to about 10 nm.

18. The method of claim 12, wherein at least one of said forming of the first layer and forming of the second layer includes employing Al in a range from about 0.5 atomic % to about 2 atomic %.

* * * * *